United States Patent
Watanabe et al.

(10) Patent No.: US 10,858,759 B2
(45) Date of Patent: Dec. 8, 2020

(54) MOLYBDENUM CRUCIBLE

(71) Applicant: A.L.M.T. Corp., Tokyo (JP)

(72) Inventors: Makoto Watanabe, Toyama (JP);
Yoshitake Fukaya, Toyama (JP);
Masahiro Katoh, Toyama (JP);
Hidenobu Nishino, Toyama (JP)

(73) Assignee: A.L.M.T. Corp., Tokyo (JP)

( * ) Notice: Subject to any disclaimer, the term of this patent is extended or adjusted under 35 U.S.C. 154(b) by 50 days.

(21) Appl. No.: 16/079,733

(22) PCT Filed: Feb. 23, 2017

(86) PCT No.: PCT/JP2017/006793
§ 371 (c)(1),
(2) Date: Aug. 24, 2018

(87) PCT Pub. No.: WO2017/146139
PCT Pub. Date: Aug. 31, 2017

(65) Prior Publication Data
US 2019/0071793 A1   Mar. 7, 2019

(30) Foreign Application Priority Data
Feb. 26, 2016   (JP) .................. 2016-035421

(51) Int. Cl.
*C30B 35/00* (2006.01)
*C30B 29/20* (2006.01)
(Continued)

(52) U.S. Cl.
CPC .............. *C30B 35/002* (2013.01); *C22F 1/18* (2013.01); *C30B 29/20* (2013.01); *F27B 14/10* (2013.01);
(Continued)

(58) Field of Classification Search
CPC .......... B22F 2998/10; B22F 3/04; B22F 3/10; B22F 3/12; B22F 5/00; C22C 1/045;
(Continued)

(56) References Cited

U.S. PATENT DOCUMENTS

| | | | |
|---|---|---|---|
| 3,898,051 A | * | 8/1975 | Schmid ................ C30B 11/003 117/83 |
| 2003/0041623 A1 | | 3/2003 | Werdecker et al. |
| 2015/0225870 A1 | | 8/2015 | Katoh et al. |

FOREIGN PATENT DOCUMENTS

| | | |
|---|---|---|
| CN | 1341080 A | 3/2002 |
| CN | 104685114 A | 6/2015 |

(Continued)

OTHER PUBLICATIONS

Office Action dated Mar. 28, 2019 in the counterpart CN Patent Application No. 201780013377.2.

*Primary Examiner* — Hua Qi
(74) *Attorney, Agent, or Firm* — Baker Botts L.L.P.; Michael A. Sartori

(57) ABSTRACT

The molybdenum crucible includes a cylindrical side wall and a bottom provided integrally with one end of the side wall. The side wall includes a coarse grain region configured to extend from an outer wall toward an inner wall and a fine grain region configured to extend from the inner wall toward the outer wall so as to be in contact with the coarse grain region. The ratio of the coarse grain region in the side wall in the thickness direction thereof is 10% or more and less than 90%. The coarse grain region is defined as such a region in which crystal grains having a grain size of 1 mm or more determined by an intercept method in the height direction of the crucible occupy 95% or more of an area of a measurement region.

7 Claims, 6 Drawing Sheets

(51) Int. Cl.
*C22F 1/18* (2006.01)
*F27B 14/10* (2006.01)
*F27D 1/00* (2006.01)
*C22F 1/00* (2006.01)
*B22F 5/00* (2006.01)
*B22F 3/12* (2006.01)
*C22C 1/04* (2006.01)

(52) U.S. Cl.
CPC .............. *F27D 1/0006* (2013.01); *B22F 3/12* (2013.01); *B22F 5/00* (2013.01); *B22F 2998/10* (2013.01); *C22C 1/045* (2013.01); *C22F 1/00* (2013.01)

(58) Field of Classification Search
CPC ... C22F 1/00; C22F 1/18; C30B 29/20; C30B 35/002; F27B 14/10; F27D 1/0006
See application file for complete search history.

(56) References Cited

FOREIGN PATENT DOCUMENTS

| | | | |
|---|---|---|---|
| CN | 105102648 A | | 11/2015 |
| JP | H02-251085 A | | 10/1990 |
| JP | H02-254285 A | | 10/1990 |
| JP | H07-278767 A | | 10/1995 |
| JP | 09196570 A | * | 7/1997 |
| JP | H09-196570 A | | 7/1997 |
| JP | 3917208 B2 | | 5/2007 |
| JP | 2010-270345 A | | 12/2010 |
| JP | 2010270345 A | * | 12/2010 |
| JP | 2011-106025 A | | 6/2011 |
| JP | 2013-060348 A | | 4/2013 |
| JP | 2013060348 A | * | 4/2013 |
| JP | 5433300 B2 | | 3/2014 |
| WO | 2012/144407 A1 | | 10/2012 |
| WO | 2015/064087 A1 | | 5/2015 |

* cited by examiner

MOLYBDENUM CRUCIBLE

TECHNICAL FIELD

The present invention relates to a molybdenum crucible.

BACKGROUND ART

Single crystal sapphire is a material excellent in transmittance and mechanical properties, and thereby is widely used as an optical material or as an epitaxial substrate for the growth of GaN, for example.

In order to grow sapphire, it is necessary to melt alumina at a temperature of 2050° C. or higher, and thereby, a crucible which can withstand the weight and pressure of the alumina at that temperature is required.

Molybdenum may be given as an example material for a crucible which can withstand such conditions.

However, at the melting temperature of alumina, the crystal grains of molybdenum constituting the crucible coarsen due to the secondary recrystallization. As a result, the grain boundary surface of coarse crystal grains becomes brittle, resulting in the formation, propagation and expansion of cracks, which may deteriorate the strength of molybdenum and cause sapphire melt to leak from grain boundary cracks.

Therefore, when a crucible made of molybdenum is used for the growth of sapphire, it is required to prevent the deterioration of the strength of molybdenum and the leakage of sapphire melt which are caused by the secondary recrystallization.

PTDs 1 and 2 each discloses a structure in which the grain size of the secondary recrystallized grains is made as large as possible so as to relatively reduce the area of the grain boundary surface, and thereby to prevent the deterioration of the strength of molybdenum.

Contrary to PTDs 1 and 2, PTDs 3 and 4 each discloses a structure in which the grain size of secondary recrystallized grains is made as small as possible so as to prevent the leakage of sapphire melt.

CITATION LIST

Patent Document

PTD 1: Japanese Patent Laying-Open No. 2-251085
PTD 2: Japanese Patent Laying-Open No. 2-254285
PTD 3: Japanese Patent Laying-Open No. 9-196570
PTD 4: Japanese Patent Laying-Open No. 2010-270345

SUMMARY OF INVENTION

Technical Problem

However, the structure described in each of PTDs 1 to 4 has the following problems.

Firstly, as described in PTDs 1 and 2, it is possible to increase the strength of the crucible by increasing the grain size of the secondary recrystallized grains as large as possible, but it is insufficient to prevent the leakage of sapphire melt from the grain boundary cracks.

On the other hand, as described in PTDs 3 and 4, by decreasing the grain size of secondary recrystallized grains as small as possible, it is possible to enhance the effect of preventing the leakage of the sapphire melt from the grain boundary cracks, but it is insufficient to improve the strength of the crucible.

As described in the above, in the conventional technology, there is a trade-off relationship between the prevention of the leakage of sapphire melt from the grain boundary cracks and the guarantee of the strength of the crucible, and at present there is no such a structure that is capable of improving both.

The present invention has been accomplished in view of the above problems, and it is therefore an object of the present invention to provide a molybdenum crucible having a structure capable of preventing the leakage of a melt and ensuring the strength of the crucible.

Solution to Problem

In order to solve the above-mentioned problems, a first aspect of the present invention provides a molybdenum crucible including a cylindrical side wall, and a bottom provided integrally with one end of the side wall. The side wall includes a coarse grain region configured to extend from an outer wall toward an inner wall along the half height of the crucible, and a fine grain region configured to extend from the inner wall toward the outer wall so as to be in contact with the coarse grain region, the ratio of the coarse grain region in the side wall in the thickness direction thereof is 10% or more and less than 90%. The coarse grain region is defined as such a region in which crystal grains having a grain size of 1 mm or more determined by an intercept method in the height direction of the crucible occupy 95% or more of the area of a measurement region, and the fine grain region is defined as such a region in which crystal grains having a grain size of 10 µm or more and 500 µm or less determined by an intercept method in the height direction of the crucible occupy 95% or more of the area of a measurement region.

A second aspect of the present invention provides a molybdenum crucible including a cylindrical side wall, and a bottom provided integrally with one end of the side wall, when the side wall is equally divided into 8 parts in the thickness direction from the inner wall side toward the outer wall side along the half height of the crucible, the aspect ratio of crystal grains in a side-wall outer region which is the seventh part when counted from the inner wall side is 3.0 or more and 20.0 or less, and when the side wall is equally divided into 8 parts in the thickness direction from the inner wall side toward the outer wall side, the aspect ratio of crystal grains in a side-wall inner region which is the second part when counted from the inner wall side is 1.0 or more and less than 3.0.

Advantageous Effects of Invention

According to the present invention, it is possible to provide a molybdenum crucible having a structure capable of preventing the leakage of a melt and ensuring the strength of the crucible.

DESCRIPTION OF EMBODIMENTS

Figure 1:
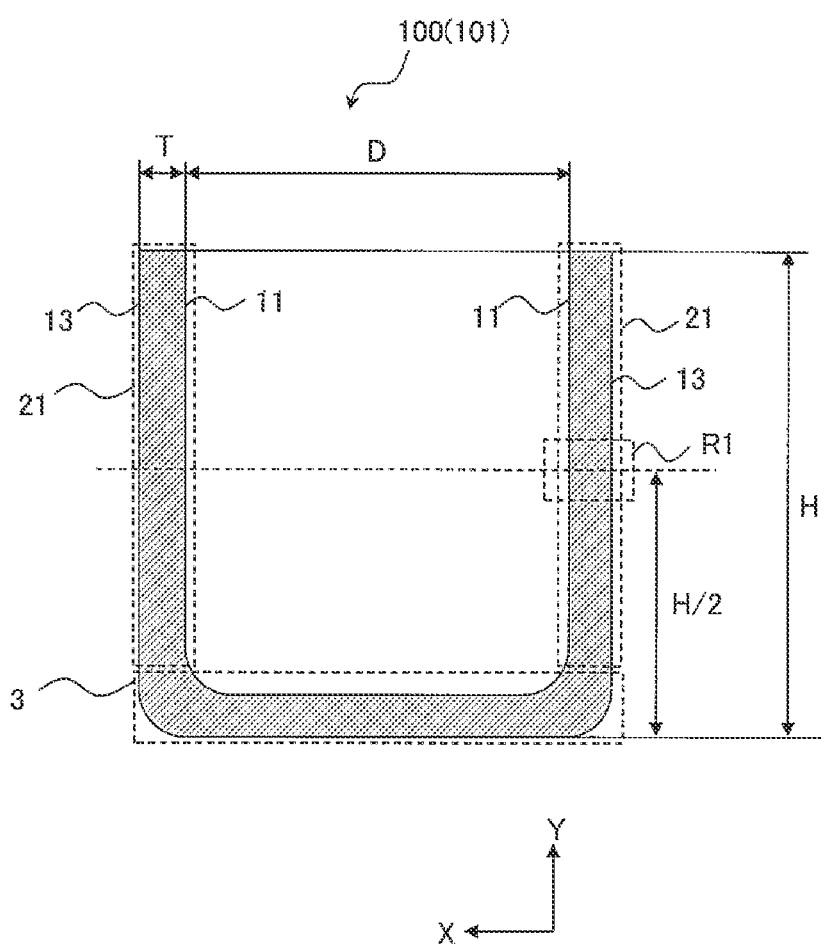
FIG. 1 is a cross-sectional view illustrating a molybdenum crucible 100 (or an untreated crucible 101)

Hereinafter, preferable embodiments of the present invention will be described in detail with reference to the drawings.

First, aspects of the present invention will be described below.

The molybdenum crucible of the present disclosure includes a cylindrical side wall, and a bottom provided integrally with one end of the side wall. The side wall includes a coarse grain region configured to extend from an outer wall toward an inner wall along the half height of the crucible, and a fine grain region configured to extend from the inner wall toward the outer wall so as to be in contact with the coarse grain region, the ratio of the coarse grain region in the side wall in the thickness direction thereof is 10% or more and less than 90%.

In the present disclosure, the coarse grain region is defined as such a region in which crystal grains having a grain size of 1 mm or more determined by an intercept method in the height direction of the crucible occupy 95% or more of the area of a measurement region, and the fine grain region is defined as such a region in which crystal grains having a grain size of 10 µm or more and 500 µm or less determined by an intercept method in the height direction of the crucible occupy 95% or more of the area of a measurement region.

It is preferable that in the molybdenum crucible, when the side wall is equally divided into 8 parts in the thickness direction from the inner wall side toward the outer wall side, a side-wall outer region which is the seventh part when counted from the inner wall side is the coarse grain region, and when the side wall is equally divided into 8 parts in the thickness direction from the inner wall side toward the outer wall side, a side-wall inner region which is the second part when counted from the inner wall side is the fine grain region. With such a configuration, it is possible to further enhance the effect of preventing the leakage of the melt and ensuring the strength of the crucible.

It is preferable that the molybdenum crucible has a purity of 99.9 mass % or more and consists of only inevitable impurities as the remainder. By adopting such a composition, even when the crucible is eroded by a molten material, it is possible to reduce contamination by the impurities to a minimum, preventing the crucible from being colored by the impurities.

Preferably, the molybdenum crucible has a Vickers hardness Hv of 140 or more and 190 or less, and more preferably has a Vickers hardness Hv of 150 or more and 180 or less. By setting the Vickers hardness within the above range, recrystallization may progress sufficiently so as to ensure a coarse grain region to be developed on the outer side.

In the molybdenum crucible, the aspect ratio of crystal grains in the side-wall inner region is preferably 1.0 or more and 2.0 or less, and more preferably 1.0 or more and 1.5 or less, which is also an evidence to prove that recrystallization has progressed sufficiently, ensuring a coarse grain region to be developed on the outer side.

Further, the molybdenum crucible of the present disclosure includes a cylindrical side wall, and a bottom provided integrally with one end of the side wall. When the side wall is equally divided into 8 parts in the thickness direction from the inner wall side toward the outer wall side along the half height of the crucible, the aspect ratio of crystal grains in a side-wall outer region which is the seventh part when counted from the inner wall side is 3.0 or more and 20.0 or less, and when the side wall is equally divided into 8 parts in the thickness direction from the inner wall side toward the outer wall side, the aspect ratio of crystal grains in a side-wall inner region which is the second part when counted from the inner wall side is 1.0 or more and less than 3.0.

It is preferable that the molybdenum crucible has a purity of 99.9 mass % or more and consists of only inevitable impurities as the remainder. By adopting such a composition, even when the crucible is eroded by a molten material, it is possible to reduce contamination by the impurities to minimum, preventing the crucible from being colored by the impurities.

It is preferable that in the molybdenum crucible, the aspect ratio of crystal grains in the side-wall outer region is 3.5 or more and 6.0 or less, and the aspect ratio of crystal grains in the side-wall inner region is 1.5 or more and 2.9 or less. By setting the aspect ratio within such a range, during the heat treatment, the side-wall inner region will become a fine grain region, and the side-wall outer region will become a coarse grain region.

It is preferable that in the molybdenum crucible, the Vickers hardness Hv of the side-wall outer region is 225 or more and 350 or less, and the Vickers hardness Hv of the side-wall inner region is 140 or more and less than 225. It is more preferable that the Vickers hardness Hv of the side-wall outer region is 230 or more and 250 or less, and the Vickers hardness Hv of the side-wall inner region is 160 or more and less than 220. By setting the Vickers hardness within the above range, during the heat treatment, the side-wall inner region will become a fine grain region, and the side-wall outer region will become a coarse grain region.

It is preferable that the molybdenum crucible has an average grain size of 10.0 µm or more and 300 µm or less. By setting the average grain size within the above range, during the heat treatment, the side-wall inner region will become a fine grain region, and the side-wall outer region will become a coarse grain region.

Next, the shape of a molybdenum crucible 100 according to an embodiment of the present invention will be described with reference to FIGS. 1 to 4.

As an example of the molybdenum crucible 100 in the present invention, a crucible for growing single crystal sapphire according to the CZ (Czochralski) method, the EFG method (Edge-defined Film-fed Growth Method), the HEM method (Heat Exchange Method) or the like is given.

As illustrated in FIG. 1, the molybdenum crucible 100 includes a cylindrical side wall 21, and a bottom 3 provided integrally with one end of the side wall 21.

Figure 2:
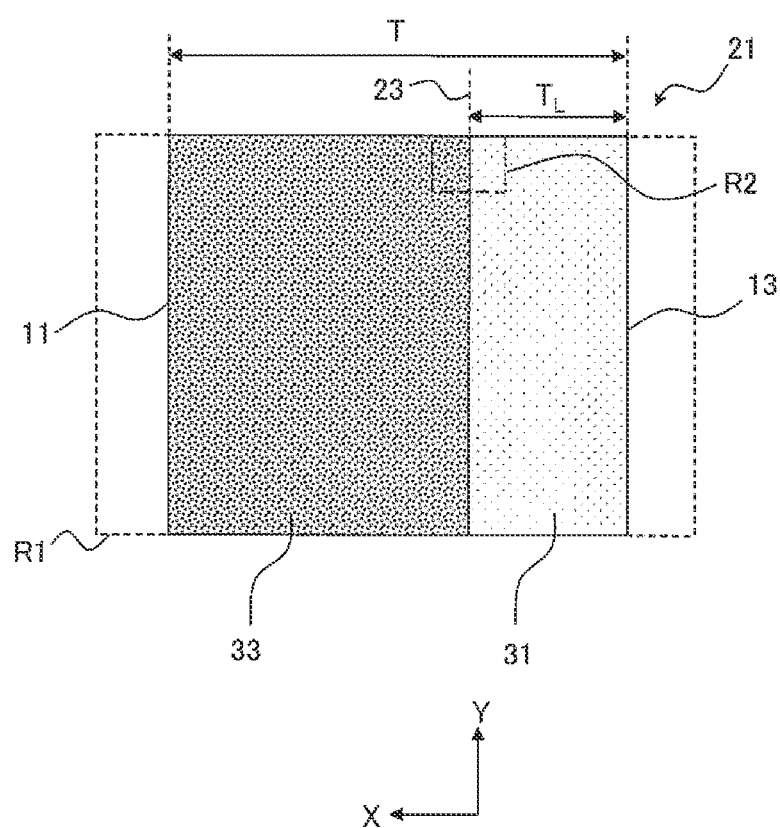
FIG. 2 is an enlarged cross-sectional view illustrating a region R1 in FIG. 1.

As illustrated in FIG. 2, the side wall 21 includes a coarse grain region 31 configured to extend from an outer wall 13 toward an inner wall 11, and a fine grain region 33 configured to extend from the inner wall 11 toward the outer wall 13 so as to be in contact with the coarse grain region 31. Specifically, the side wall 21 has two layers composed of the coarse grain region 31 on the side of the outer wall 13 in contact with the fine grain region 33 on the side of the inner wall 11 via a boundary 23.

Next, the requirements in the structure and composition of the molybdenum crucible 100 will be described.

<Composition>

The material constituting the molybdenum crucible 100 is preferably molybdenum having a purity of 99.9 mass % or more and consisting of only inevitable impurities as the remainder. By adopting such a composition, even when the crucible is eroded by a molten alumina, it is possible to reduce contamination by the impurities to a minimum, preventing the crucible from being colored by the impurities.

<Grain Size Distribution>

The ratio of the coarse grain region 31 in the side wall 21 in the thickness direction (X direction in FIG. 1) is preferably 10% or more and less than 90%, and more preferably 40% or more and less than 80%.

More specifically, the ratio (TL/T) of a width TL of the coarse grain region 31 to a thickness T of the side wall 21 in FIG. 2 is preferably 0.1 or more and less than 0.9, and more preferably 0.4 or more and less than 0.8.

Here, the coarse grain region 31 is defined as such a region in which crystal grains having a grain size of 1 mm or more determined by an intercept method in the height direction of the crucible occupy 95% or more of the area of a measurement region, and the fine grain region 33 is defined as such a region in which crystal grains having a grain size of 10 μm or more and 500 μm or less determined by an intercept method in the height direction of the crucible occupy 95% or more of the area of a measurement region.

When the number of crystal grains having a grain size of 10 μm or more and 500 μm or less (i.e., fine grains) determined by an intercept method in the height direction of the crucible is counted from the side of the outer wall 13, the position of a grain boundary of a fifth crystal grain (see 5 dotted crystal grains 41 in FIG. 3) is set as the boundary 23 between the coarse grain region 31 and the fine grain region 33. The reason thereof will be explained hereinafter.

First, since the region near the boundary 23 (for example, the region R2 in FIG. 3) is such a region that does not satisfy any of the definitions of the coarse grain region 31 and the fine grain region 33, the boundary 23 can not be defined by using the definitions of the coarse grain region 31 and the fine grain region 33, it is necessary to define the boundary 23 separately.

Figure 3:
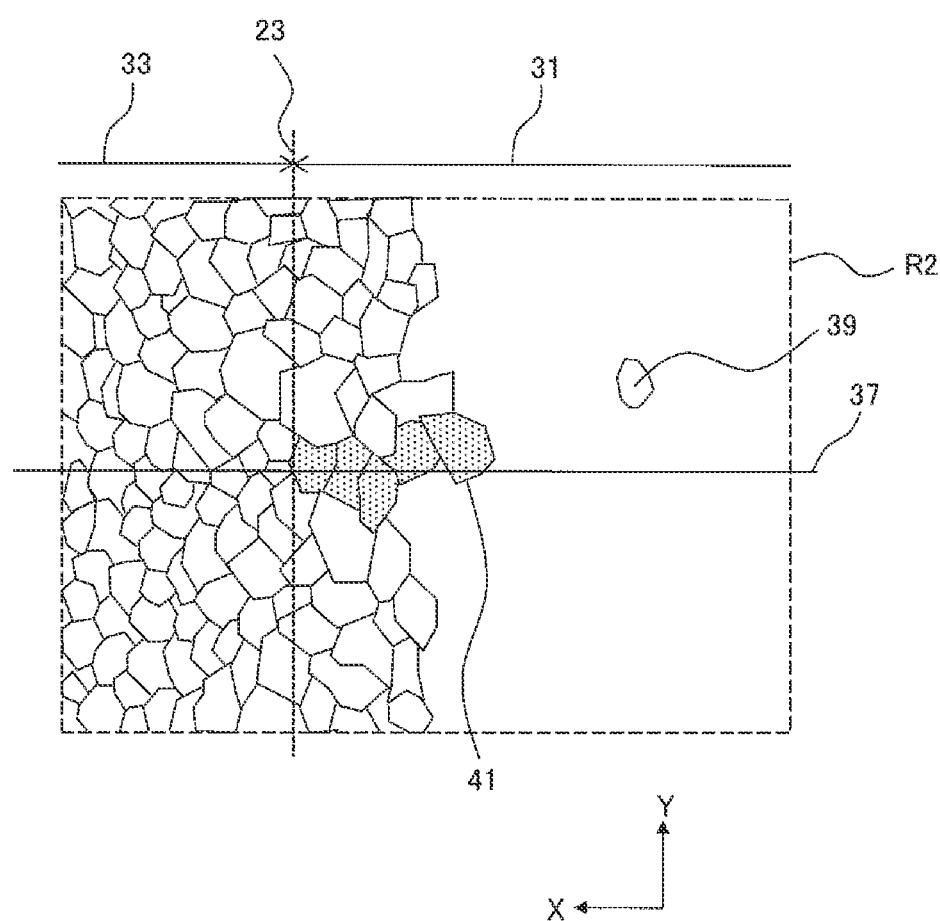
FIG. 3 is an enlarged cross-sectional view illustrating a region R2 in FIG. 2 (It seems that no crystal grain is present in a coarse grain region 31, the reason thereof is because that the size of crystal grain is larger than the region R2, in other words, the number of crystal grains in the coarse grain region 31 contained inside the region R2 is 1).

If the grain boundary between coarse grains and fine grains is simply set as the boundary 23, when a fine grain 39 is isolated in the coarse grain region 31 as illustrated in FIG. 3, the position of the boundary 23 may be too close to the side of the coarse grain region 31.

The developing conditions so as to achieve the ratio between the coarse grain region and the fine grain region will be described. Generally, the growth speed of crystal grains differs depending on the temperature and time of heat treatment. In addition, it is assumed that any kind of crystal grains will eventually grow to coarse grains if subjected to heat treatment for a long time. In the present invention, the crucible consists of an outer region where the growth of crystal grains is fast and an inner region where the growth of crystal grains is slow, compared with a conventional crucible, the two-layer structure consisting of a fine grain region and a coarse grain region is developed immediately after the start of the heat treatment, and lasts for a long time. After the two-layer structure is developed, the proportion thereof gradually changes with the lapse of time. The present invention is aimed to develop such a two-layer structure. The heat treatment performed here is also performed in the actual growth of sapphire.

Hereinafter, the reason why the side wall 21 should have such a grain size distribution will be described.

As described in the above, as the size of the crystal grains in the crucible becomes smaller, the grain boundaries become intricate, which makes it possible to enhance the effect of preventing sapphire melt from leaking from the grain boundary cracks, but it will decrease the strength of the crucible.

On the opposite, as the size of the crystal grains in the crucible becomes larger, the number of the grain boundaries decreases, which makes it possible to increase the strength of the crucible, but it may cause the sapphire melt to easily leak from the grain boundary cracks.

After intensive studies on these problems, the inventors of the present invention have found that if the size of the crystal grains on the side of the inner wall 11 in contact with the sapphire melt is made smaller than those on the side of the outer wall 13, or the size of the crystal grains on the side of the outer wall 13 is made larger than those on the side of the inner wall 11, it is possible to prevent the leakage of melt while ensuring the strength of the crucible, and thereby have achieved such structure.

Specifically, by making the size of the crystal grains on the side of the inner wall 11 in contact with the sapphire melt smaller than those on the side of the outer wall 13, it is possible to enhance the effect of preventing the leakage of the sapphire melt.

On the other hand, by making the size of the crystal grains on the side of the outer wall 13 larger than those on the side of the inner wall 11, the inner wall 11 inferior in strength is covered with the outer wall 13 excellent in strength, which makes it possible to ensure the strength of the crucible.

In addition, it is advantageous that the crucible having this structure can be expected to have a long life even it is repeatedly used, and the crucible can be manufactured to have a high strength even if the wall thickness is made thinner than a crucible of the prior art, which makes it possible to reduce the weight of the crucible and the cost of raw materials.

Figure 4:
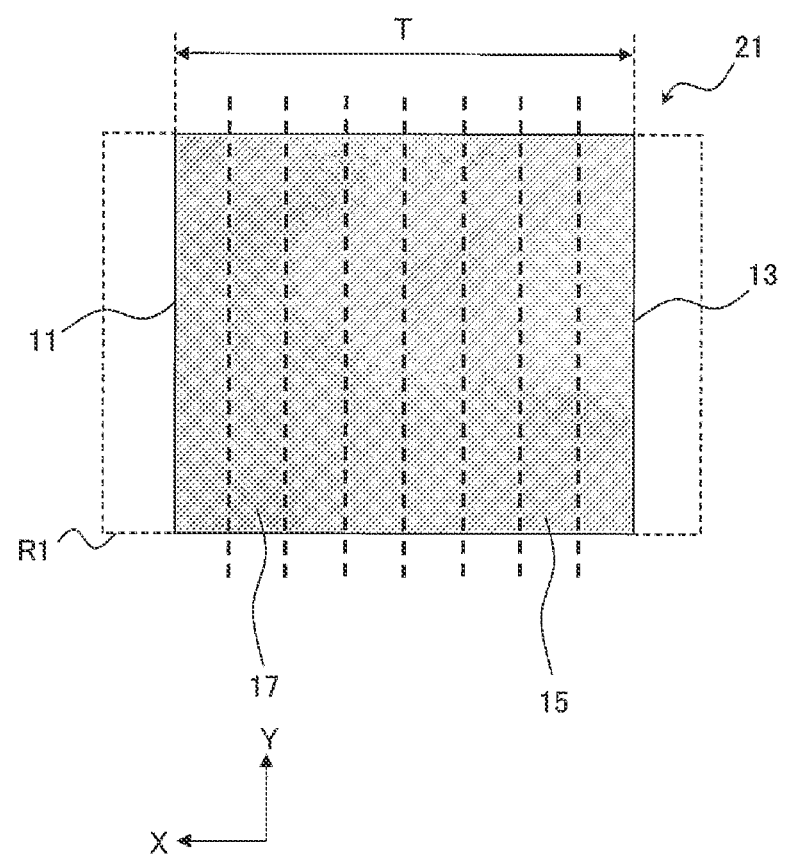
FIG. 4 is an enlarged cross-sectional view illustrating the region R1 in FIG. 1.

As illustrated in FIG. 4, when the thickness T of the side wall 21 is equally divided into 8 parts from the side of the inner wall 11 to the side of the outer wall 13, a side-wall outer region 15 which is the seventh part when counted from the side of the inner wall 11 is the coarse grain region 31, and when the thickness T of the side wall 21 is equally divided into 8 parts from the side of the inner wall 11 to the side of the outer wall 13, a side-wall inner region 17 which is the second part when counted from the side of the inner wall 11 is preferably the fine grain region 33. Under such condition, it is possible to obtain the same effects even when the ratio of the coarse grain region 31 in the side wall 21 in the thickness direction thereof is 10% or more and less than 90%. Also, it is advantageous that under such condition, there is no need to determine the boundary 23.

Hereinafter, the definition of the size of the crystal grains and the definition of the fine grain region 33 and the coarse grain region 31 will be described in detail.

The size of the crystal grains is obtained by the following procedure.

First, a rectangular section of 500 μm×2 mm (X direction×Y direction in FIG. 1) is taken from a section of a target region as a unit, the grain size L in the height direction (Y direction in FIG. 1) of the crystal grains present in the section is determined by an intercept method.

Next, a region in which crystal grains having the grain size L of 1 mm or more occupy 95% or more of the area is defined as the coarse grain region 31.

Further, a region in which crystal grains having the grain size L of 10 µm or more and 500 µm or less occupy 95% or more of the area is defined as the fine grain region 33.

The position in the height direction of the crucible where the size of the crystal grains in the side-wall outer region 15 and the side-wall inner region 17 is actually determined is, for example, the half height of the crucible, in other words, the position of H/2 in FIG. 1.

In the above example, the grain size is defined on the basis of only the grain size L of the crystal grains in the height direction of the crucible, and the grain size of the crystal grains in the thickness direction (X direction in FIG. 1) of the crucible (the side wall 21) is not taken into consideration. The reason for that is because when the thickness T of the crucible is equally divided from the side of the inner wall 11 to the side of the outer wall 13, depending on the thickness T of the crucible, T/8 may become less than 500 µm (in other words, the upper limit of the size of the crystal grains in the fine grain region 33), which makes it difficult to define the fine grain region based on the grain size in the thickness direction. Specifically, when the thickness of the side wall 21 is less than 4 mm, T/8 is less than 500 µm.

However, when the thickness of the side wall 21 exceeds 4 mm, T/8 exceeds 500 µm. In this case, the fine grain region 33 may be defined based on the grain size in the thickness direction of the side wall 21. The definition of the fine grain region 33 in this case may be carried out as follows.

First, the grain size L in the height direction of the crucible and the grain size W in the thickness direction of the crucible are determined according to the intercept method.

Next, the average grain size is calculated from L and W by using the following formula:

average grain size=(L+W)/2

Finally, a region in which crystal grains having an average grain size (L+W)/2 of 10 µm or more and 500 µm or less occupy 95% or more of the area is defined as the fine grain region 33.

<Aspect Ratio>

The aspect ratio of the fine grain region 33 is preferably 1.0 or more and 2.0 or less, and more preferably 1.0 or more and 1.5 or less.

It should be noted that depending on the width of the side wall 21, the grain size W may become larger than the width of each region obtained by equally dividing the side wall into 8 parts in the thickness direction, which makes it difficult to define the aspect ratio, and thereby, the aspect ratio of the coarse grain region 31 is not defined in particular.

<Hardness>

The hardness of the molybdenum crucible 100 in terms of Vickers hardness (Hv, the same applies hereinafter) is preferably 140 or more and 190 or less, and more preferably 150 or more and 180 or less.

<Requirements Before Heat Treatment>

Next, the requirements for obtaining a crucible having such a crystal structure will be described.

As described in the above, the molybdenum crucible 100 is subjected to a temperature of 2050° C. or higher (in other words, it is heat-treated at 2050° C. or higher) during the growth of single crystal sapphire. In order to enable the molybdenum crucible 100 to have a structure including the fine grain region 33 and the coarse grain region 31, it is preferable that the crucible before heat treatment is configured to have a gradient in hardness and worked structure from the side of the outer wall 13 to the side of the inner wall 11.

By adopting such a configuration, it is possible to obtain a structure including the fine grain region 33 and the coarse grain region 31 after heat treatment.

In the following description, the crucible before heat treatment is referred to as an untreated crucible 101. In addition, the untreated crucible 101 has the same shape as that of the molybdenum crucible 100 as illustrated in FIG. 1.

Specific requirements for the untreated crucible 101 are as follows.

First, the aspect ratio of crystal grains in the side-wall outer region 15 of the untreated crucible 101 is preferably 3.0 or more and 20.0 or less, and the aspect ratio of the crystal grain in the side-wall inner region 17 before heat treatment is preferably 1.0 or more and less than 3.0.

More preferably, the aspect ratio of crystal grains in the side-wall outer region 15 of the untreated crucible 101 is 3.5 or more and 6.0 or less, and the aspect ratio of crystal grains in the side-wall inner region 17 of the untreated crucible 101 is 1.5 or more and 2.9 or less.

Next, the average grain size of crystal grains in the untreated crucible 101 is preferably 10.0 µm or more and 300 µm or less, and more preferably 20-150 µm or less.

In addition, the Vickers hardness Hv of the side-wall outer region 15 of the untreated crucible 101 is preferably 225 or more and 350 or less, and the Vickers hardness Hv of the side-wall inner region 17 is preferably 140 or more and less than 225.

More preferably, the Vickers hardness Hv of the side-wall outer region 15 is 230 or more and 250 or less, and the Vickers hardness Hv of the side-wall inner region 17 is 160 or more and less than 220.

When the untreated crucible 101 satisfying these requirements is subjected to heat treatment, if the thickness T of the side wall 21 is equally divided into 8 parts from the side of the inner wall 11 toward the side of the outer wall 13, the side-wall outer region 15 which is the seventh part when counted from the side of the inner wall 11 becomes the coarse grain region 31, and if the thickness T of the side wall 21 is equally divided into 8 parts from the side of the inner wall 11 toward the side of the outer wall 13, the side-wall inner region 17 which is the second part when counted from the side of the inner wall 11 becomes the fine grain region 33.

The above-mentioned requirements for the untreated crucible 101 are given as examples, and it does not mean that the molybdenum crucible 100 can not be obtained through heat treatment unless the above-described requirements are satisfied. In addition, depending on the history of plastic working, the aspect ratio and the limit value of the hardness of the side-wall outer region 15 and the side-wall inner region 17 of the untreated crucible 101 may slightly deviate from the above-mentioned range.

In the above embodiment, the aspect ratio and the hardness are defined at the half height of the crucible. This is based on the consideration that even if the sapphire raw material is filled up to the upper part of the crucible, after the sapphire raw material is melted, the volume of the melted raw material is about a half of the volume of the filled raw material. In other words, since the upper part of the crucible is not in contact with the melted sapphire raw material, the entire upper part may contain coarse grains.

<Manufacturing Method>

Hereinafter, a method for manufacturing the molybdenum crucible 100 will be described with reference to FIG. 5.

The method of manufacturing the molybdenum crucible 100 is not specifically limited as long as it can manufacture the molybdenum crucible 100 having the grain size distribution mentioned above. The following method is given as an example.

Figure 5:
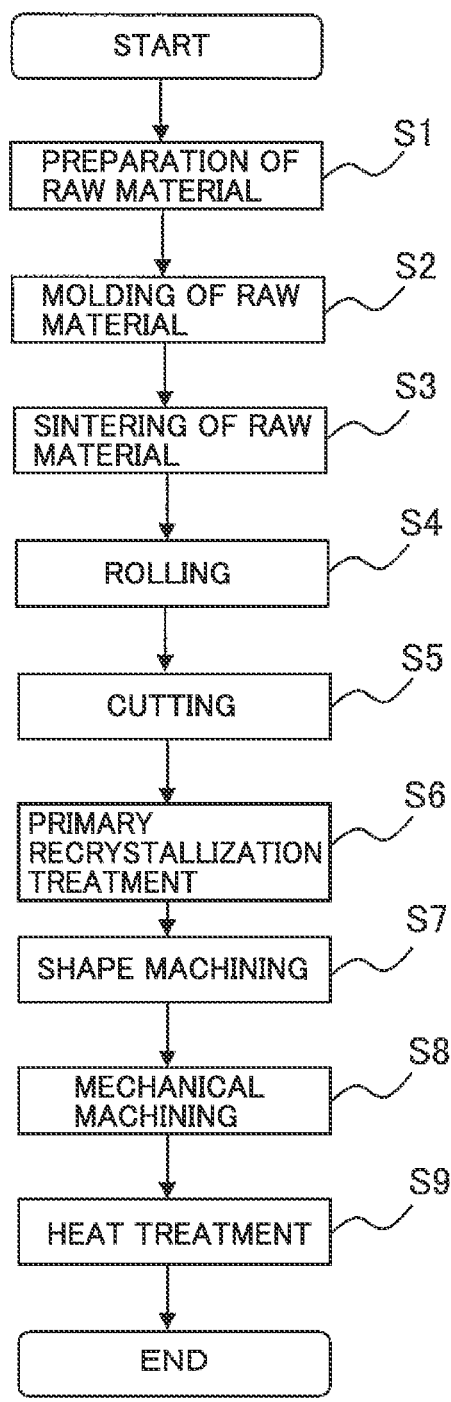
FIG. 5 is a flowchart illustrating an example of a method for manufacturing the molybdenum crucible 100.

First, molybdenum powder is prepared as the raw material (S1 in FIG. 5). Specifically, it is preferable to use the molybdenum powder having a Fsss (Fisher Sub-Sieve Sizer) grain size of 1 μm or more and 10 μm or less. This is because when the grain size is smaller than 1 μm, the powder is highly ignitable, which makes it unsuitable for industrial usage, and when the grain size is greater than 10 μm, it is difficult to prepare the raw material by powder metallurgy.

Next, the molybdenum powder is filled in a plastic container and molded uner pressure (S2 in FIG. 5).

When filling the powder, a partition member is firstly inserted into the plastic container, 3N to 3N5 molybdenum powder is filled from one end, and 4NUP molybdenum powder (having a higher molybdenum purity) is filled from the other end, and thereafter, by removing the partition member, it is possible to obtain a molded body having two layers of different molybdenum compositions (different molybdenum purities).

The purity of the molybdenum powder is analyzed according to the Standard No. 0001 (tungsten and molybdenum analysis method) in the Standards by Japan Tungsten & Molybdenum Industries Association (TMIAS).

The powder is subjected to isostatic press (cold isostatic press) under a pressure of, for example, 1 ton/cm$^2$ or more and 3 ton/cm$^2$ or less.

Next, the obtained powder compact is sintered (S3 in FIG. 5).

Specifically, the powder compact is sintered in a hydrogen sintering furnace at a temperature of 1700° C. or more, preferably 1800° C. or more and 2300° C. or less for 5 hours or more and 30 hours or less, for example. If the powder compact is sintered at a temperature less than 1700° C., the density of the sintered body is insufficient, which may extremely deteriorate the subsequent processing yield. On the other hand, sintering the powder compact at a temperature higher than 2300° C. may lead to the early aging of the hydrogen sintering furnace or shorten the life of the hydrogen sintering furnace, resulting in an increase in production cost, and is thereby industrially impractical.

Next, the obtained sintered body is rolled into a flat plate shape (S4 in FIG. 5).

Specifically, the sintered body is placed in a hydrogen heating furnace, and heated for 10 minutes or more and 30 minutes or less at a temperature of, for example, 1100° C. or more and 1400° C. or less, and thereafter subjected to hot rolling.

Next, the plate obtained after the hot rolling is cut into a disk by a method such as wire cutting (S5 in FIG. 5).

Next, the obtained disk is subject to primary recrystallization treatment (S6 in FIG. 5) to facilitate the bending of the disk into a crucible shape for subsequent processing and facilitate the control of the working ratio.

Specifically, the disk is heated, for example, at a temperature of 1100° C. or more and 1400° C. or less (for example, 1200° C.) for 10 minutes or more and 60 minutes or less. If the heat treatment is performed at a temperature lower than 1100° C., the material may not recrystallize completely, and if the heat treatment is performed at a temperature higher than 1400° C., the crystal grains may become too large, and if the heat treatment is performed at a further high temperatures, secondary recrystallization may occur, resulting in coarse grains at this stage, neither of which is not suitable for subsequent processing.

Next, the disk is machined into a crucible shape by using a metal lathe or the like (S7 in FIG. 5). The specific procedure will be described in the following, for example.

First, a mold is attached to a spinning machine, and the rolled disk is fixed on the mold by using a push rod. At this time, in the case where the molded body has two layers of different compositions, the molded body is arranged in such a manner that the 4N molybdenum layer (containing molybdenum powder in higher purity) is located at the outside of the crucible after processing. Next, the disk is heated to glow in air, and the outer periphery of the disk is spin-machined into a crucible shape by moving a roller in follow of the mold. Due to the ratio of the two kinds of powders and the machining ratio on the side wall by spin-machining, the structure and the hardness of the present embodiment are achieved.

The machining temperature is preferably 500° C. or higher and 1200° C. or lower. If the temperature is lower than 500° C., cracks are likely to occur during the machining, which extremely deteriorates the machining yield. On the other hand, if the temperature is higher than 1200° C., recrystallization progresses during the machining, which extremely deteriorates the machining yield in subsequent steps.

Next, if necessary, finishing is performed on the crucible by using a general-purpose lathe, a vertical lathe or the like so as to obtain the final crucible (S8 of FIG. 5).

According to the above procedure, the untreated crucible 101 satisfying the requirements before heat treatment is achieved.

Next, the untreated crucible 101 is subject to heat treatment so as to produce a heat-treated molybdenum crucible 100 (S9 of FIG. 5).

The heat treatment is performed at, for example, 1800° C. or more and 2400° C. or less (for example at 2000° C.) for 30 minutes or more. The atmosphere is preferably reducing gas, inert gas, or vacuum.

Since the heat treatment can actually promote the growth of sapphire, there is no need to perform recrystallization in advance.

Thus, in consideration of shocks or the like in transporting the crucible, it may be transported in the state of the crucible 101 without heat treatment.

The above is an example of a method for manufacturing the molybdenum crucible 100.

As described in the above, according to the present embodiment, the molybdenum crucible 100 includes a cylindrical side wall 21, and a bottom 3 provided integrally with one end of the side wall 21. The side wall 21 includes a coarse grain region 31 configured to extend from an outer wall 13 toward an inner wall 11, and a fine grain region 33 configured to extend from the inner wall 11 toward the outer wall 13 so as to be in contact with the coarse grain region 31, the ratio of the coarse grain region 31 in the side wall 21 in the thickness direction thereof is 10% or more and less than 90%.

Therefore, molybdenum crucible 100 can both prevent the leakage of a melt and ensure the strength of the crucible.

EXAMPLES

Hereinafter, the present invention will be described in more detail on the basis of examples.

Example 1

According to the procedure illustrated in FIG. 5, the molybdenum crucible 100 was manufactured by changing the working ratio when molding the disk into a crucible shape, and the structure and properties were evaluated. The specific procedure is as follows.

First, one kind of molybdenum powder having a Fsss average grain size of 4.5 μm and a purity of 99.9 mass %, and the other kind of molybdenum powder having a Fsss average grain size of 4.9 μm and a purity of 99.99 mass % were prepared as the raw material powder.

Next, two kinds of molybdenum powder were filled into a rubber container inserted with a partition member, respectively, the partition member was removed, and thereafter, the CIP (Cold Isostatic Pressing) and the sintering were performed to produce 3 sintered ingots having two layers.

Next, the obtained sintered ingots were machined into a crucible shape through rolling, heat treatment, and metal lathe processing (also referred to as spinning). 3 samples were prepared at three conditions according to different working ratios, i.e., spinning rate of the side wall 21, specifically, sample A at the spinning rate of 60%, sample B at the spinning rate of 30%, and sample C at the spinning rate of 20%.

The working ratio was defined by the following formula:

Working ratio={(Thickness before spinning−Thickness after spinning)/(Thickness before spinning)}×100

Figure 6:
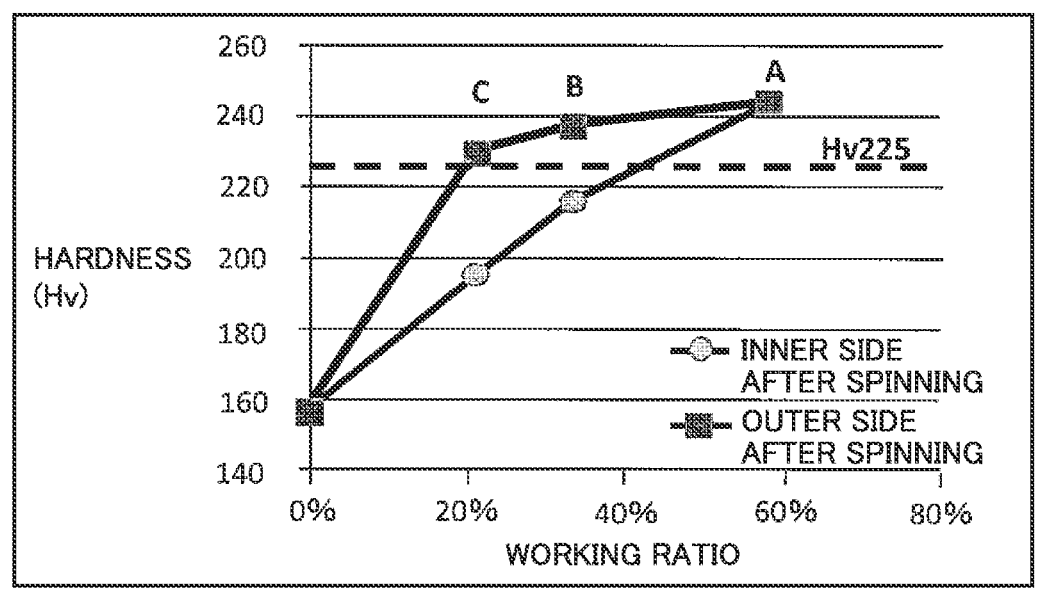
FIG. 6 is a diagram illustrating the relationship between the working ratio and the hardness of a crucible in Example 1.
Figure 7:
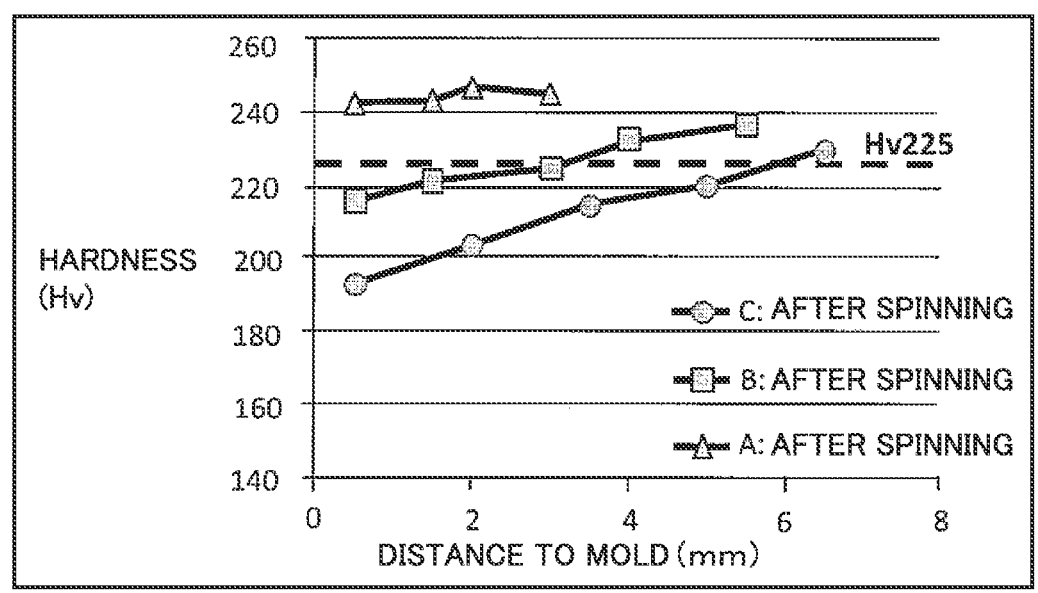
FIG. 7 is a diagram illustrating the relationship between the distance of each of samples A, B and C to a mold and the hardness thereof in Example 1.

FIG. 6 illustrates the relationship between the hardness and the working ratio of the crucible, and FIG. 7 illustrates the relationship between the distance (unit: mm) from each of the samples A, B and C to the mold and the hardness. FIG. 6 also illustrates the hardness of a comparative sample before spinning (sample with a working ratio of 0%).

The hardness (Vickers hardness) was measured at a load of 10 kg. The hardness were measured at 12 spots which are equally distributed in the side-wall outer region 15 and the side-wall inner region 17 along the circumferential direction of the side wall 21 with a height equal to the half height (½H in FIG. 1) of the crucible, and the average value was taken as the hardness.

As illustrated in FIG. 6, the difference of the hardness between the side-wall inner region 17 and the side-wall outer region 15 is maximum when the working ratio is around 20%, and thereafter the difference decreases, and when the working ratio is 60%, the difference is almost zero. In other words, the difference of the hardness between the side-wall inner region and the side-wall outer region was present in the range of the working ratio of more than 0% and less than 60%.

Further, as illustrated in FIG. 7, the hardness of the side wall 21 became higher as the distance to mold increases.

Next, the average grain size (L+W)/2, the aspect ratio and the hardness of the side-wall outer region 15 and the side-wall inner region 17 of each of the samples A, B and C were measured. The results are listed in Table 1. In Table 1, "material" refers to a material before spinning.

TABLE 1

| Measured Sample and Spot | Average grain size (μm) | Aspect ratio | Hardness (Hv) |
| --- | --- | --- | --- |
| A's outer side | 38.4 | 4.8 | 244 |
| B's outer side | 46.6 | 4.5 | 243 |
| C's outer side | 36.1 | 3.3 | 225 |
| A's inner side | 39.6 | 5.4 | 244 |
| B's inner side | 39.8 | 2.5 | 220 |
| C's inner side | 38.5 | 1.5 | 196 |
| Material (raw) | 50.2 | 1 | 157 |

As obviously shown in Table 1, the average grain size slightly decreased after the spinning process, the aspect ratio and the hardness increased after the spinning process.

Next, the spinning-processed crucible was heat-treated at 2000° C. for 1 hour under vacuum atmosphere.

After that, the structure of the heat-treated sample was observed with a microscope, and the average grain size, the aspect ratio and the hardness were measured under the same conditions as those before heat treatment.

The average grain size, the aspect ratio and the hardness after heat treatment are listed in Table 2.

TABLE 2

| | After Heat Treatment | | | | |
| --- | --- | --- | --- | --- | --- |
| Measured Sample and Spot | Working ratio | Average grain size (μm) | ratio of coarse grain region | L/W | Hardness (Hv) |
| A's outer side | 60% | ≥10 mm | 100% | — | 172 |
| A's inner side | | ≥10 mm | | — | 174 |
| B's outer side | 40% | ≥10 mm | 50% | — | 180 |
| B's inner side | | 77 | | 1.3 | 164 |
| C's outer side | 20% | ≥10 mm | 20% | — | 171 |
| C's inner side | | 127.9 | | 1.1 | 152 |
| Material (raw) | | 52.6 | | 1 | 158 |

First, there was no significant difference in grain size distribution between the raw material before heat treatment and the raw material after heat treatment.

On the other hand, as shown in Table 2, after sample A was heat treated, all the crystal grains in the side wall 21 coarsened.

Further, as shown in Table 2, after samples B and C were heat treated, the crystal grain sizes in the side-wall inner region 17 and the side-wall outer region 15 of the side wall became different, the side wall became a two-layered structure including the fine grain region 33 and the coarse grains region 31. In samples B and C, the ratios of the fine grain region 33 and the coarse grain region 31 were different.

Next, the obtained crucible was used to conduct alumina (sapphire) melting test.

First, a crucible not subjected to the final heat treatment (heat treatment at 2000° C. for 1 hour), that is the untreated crucible 101, and a crucible subjected to the final heat treatment, that is the heat-treated crucible (molybdenum crucible 100) were prepared at a number of 12 each. Each crucible had a height H of 100 mm and an inner diameter D of 300 mm (see FIG. 1).

Next, alumina powder was filled in the crucible by using a known single crystal sapphire growing apparatus, the alumina powder was melted at a maximum temperature of 2150° C. and maintained at the same temperature for 5 hours, and thereafter cooled to 400° C. over 10 hours in one cooling cycle, the following items such as the leakage of sapphire, the deformation amount of the side wall, and the contamination status by foreign matters were confirmed.

The method for evaluating each item will be described below.

(1) Confirmation of the Leakage of Sapphire

The crucible after cooling was visually confirmed, and the leakage of sapphire was confirmed.

Specifically, a number of 12 crucibles were prepared under the same conditions and subjected to the melting test under the same conditions, and after the melting test, the ratio of the crucibles in which the leakage of sapphire occurred was investigated.

(2) Confirmation of the Deformation Amount of the Side Wall

After each crucible was subjected to the melting test, the amount of change in the outer diameter of the side wall at the half height of the crucible was measured.

If the amount of change in the outer diameter is less than 1% (less than 0.5% for one of the side walls), it is denoted as "No deformation", if the amount of change in the outer diameter is more than 1% and less than 1.5%, it is denoted as "slight deformation", and if the amount of change in the outer diameter is 1.5% or more, it is denoted as "deformed".

(3) Confirmation of the Contamination Status by Foreign Matters

Since the sapphire growth apparatus is heated by using a carbon heater, after use, the carbon contamination was evaluated by analyzing the cross section of the side wall using EPMA (Electron Probe Micro Analyzer). The side wall was analyzed at the half height of the crucible (½H spot in FIG. 1).

The evaluation results of the crucible before heat treatment are listed in Table 3 and the evaluation results of the crucible after heat treatment are listed in Table 4.

In Tables 3 and 4, the crucibles having the same numbers are manufactured under the same conditions before heat treatment, but they are not the same item. This is because that in order to measure the hardness and the aspect ratio of a untreated crucible, it must be subjected to a destructive inspection, and thereby, that crucible can not be subjected to heat treatment and any subsequent test. Therefore, in the present example, 2 crucibles were manufactured under the same conditions, one was evaluated without being subjected to heat treatment, and the other was heat-treated and evaluated.

TABLE 3

| | Before heat treatment | | | | | | | |
|---|---|---|---|---|---|---|---|---|
| Sample No. | Aspect ratio of inner side | Aspect ratio of outer side | Hardness of inner side | Hardness of outer side | Ratio of coarse grain region after heat treatment | (Result) Leakage rate | (Result) Deformation | (Result) Contamination |
| 1 | 1 | 1.1 | 157 | 161 | 0% | 0% | YES | +++ |
| 2 | 1.3 | 2.8 | 175 | 215 | 0% | 0% | YES | +++ |
| 3 | 1.5 | 2.8 | 189 | 222 | 0% | 0% | YES | +++ |
| 4 | 1.2 | 2.9 | 175 | 221 | 0% | 0% | YES | +++ |
| 5 | 1.5 | 3.3 | 196 | 225 | 10% | 0% | Slight | ++ |
| 6 | 2.1 | 4.1 | 210 | 237 | 40% | 0% | NO | ++ |
| 7 | 2.5 | 4.5 | 217 | 243 | 50% | 0% | NO | ++ |
| 8 | 2.7 | 4 | 219 | 232 | 60% | 0% | NO | ++ |
| 9 | 2.9 | 5.2 | 220 | 245 | 80% | 0% | NO | ++ |
| 10 | 3.1 | 4.8 | 222 | 241 | 90% | 5% | NO | + |
| 11 | 5.4 | 4.8 | 244 | 244 | 100% | 10% | NO | + |
| 12 | 6.6 | 7.2 | 249 | 252 | 100% | 10% | NO | + |

+++: Grain boundary is uniformly contaminated. Because there are more grain boundaries, there are more impurities.
++: Inner grain boundary is also contaminated but less due to the outer single crystal effect.
+: Grain boundary is uniformly contaminated. Because there are few grain boundaries, there are few impurities.

TABLE 4

| | After heat treatment | | | | | | | |
|---|---|---|---|---|---|---|---|---|
| Sample No. | Grain size L in height direction of inner side (μm) | Grain size L in height direction of outer side (μm) | Average grain size of inner side (L + W)/2 (μm) | Average grain size of outer side (L + W)/2 (μm) | Ratio of coarse grain region | (Result) Leakage rate | (Result) Deformation | (Result) Contamination |
| 1 | 53.3 | 59.0 | 52.6 | 55.4 | 0% | 0% | YES | +++ |
| 2 | 93.6 | 105.3 | 95.2 | 100.6 | 0% | 0% | YES | +++ |
| 3 | 122.9 | 86.2 | 119.8 | 83.7 | 0% | 0% | YES | +++ |
| 4 | 82.5 | 67.9 | 78.3 | 66.6 | 0% | 0% | YES | +++ |
| 5 | 136.1 | 10 mm or more | 127.9 | 10 mm or more | 20% | 0% | Slight | ++ |
| 6 | 111.2 | 10 mm or more | 110.3 | 10 mm or more | 40% | 0% | NO | ++ |
| 7 | 85.9 | 10 mm or more | 77.0 | 10 mm or more | 50% | 0% | NO | ++ |
| 8 | 94.4 | 10 mm or more | 92.6 | 10 mm or more | 50% | 0% | NO | ++ |
| 9 | 112.9 | 10 mm or more | 103.1 | 10 mm or more | 80% | 0% | NO | ++ |

TABLE 4-continued

| | After heat treatment | | | | | | | |
|---|---|---|---|---|---|---|---|---|
| Sample No. | Grain size L in height direction of inner side (μm) | Grain size L in height direction of outer side (μm) | Average grain size of inner side (L + W)/2 (μm) | Average grain size of outer side (L + W)/2 (μm) | Ratio of coarse grain region | (Result) Leakage rate | (Result) Deformation | (Result) Contamination |
| 10 | 10 mm or more | 10 mm or more | 10 mm or more | 10 mm or more | 90% | 5% | NO | + |
| 11 | 10 mm or more | 10 mm or more | 10 mm or more | 10 mm or more | 100% | 10% | NO | + |
| 12 | 10 mm or more | 10 mm or more | 10 mm or more | 10 mm or more | 100% | 10% | NO | + |

+++: Grain boundary is uniformly contaminated. Since there are more grain boundaries, there are more impurities.
++: Inner grain boundary is contaminated, but it is less contaminated due to the outer single crystal effect.
+: Grain boundary is uniformly contaminated. Since there are few grain boundaries, there are few impurities.

As shown in Tables 3 and 4, the following results were obtained.

First, regarding the leakage of sapphire, the leakage of sapphire was observed in samples (No. 10 to 12) in which the ratio of the coarse grain region 31 was 90% or more, while no leakage of sapphire was observed in samples (No. 1 to 9) in which the ratio of the coarse grain region 31 was 0% or more and less than 90%.

Next, regarding the amount of deformation in the side wall, the deformation was observed in samples (No. 1 to 4) in which the ratio of the coarse grain region 31 was 0%, slight deformation (allowed deformation in the growth of single crystal sapphire) in which the ratio of the coarse grain region 31 was 20%, while no deformation was observed in samples (No. 6 to 12) in which the ratio of the coarse grain region 31 was more than 20%.

Next, regarding the contamination by foreign matters, in samples where the coarse grain region 31 was present in the side-wall outer region 15, the contamination to the inside along the grain boundary was alleviated.

Therefore, in order to prevent the leakage of melt while suppressing deformation at high temperatures and prevent contamination by foreign matters so as to prolong the life of the crucible, it is necessary to satisfy the requirements such as the hardness and the aspect ratio described in samples No. 5 to 9 of the embodiment.

Specifically, the following requirements should be satisfied:

(1) It is preferable that the aspect ratio of crystal grains in the side-wall outer region 15 before heat treatment is 3.0 or more and 6.0 or less.

(2) It is preferable that the aspect ratio of crystal grains in the side-wall inner region 17 before heat treatment is 1.5 or more and 2.9 or less.

(3) The hardness of the side-wall outer region 15 before heat treatment is preferably 225 or more and 350 or less, and more preferably Hv 230 or more and 250 or less.

(4) The hardness Hv of the side-wall inner region 17 before heat treatment is preferably 140 or more and less than 225, and more preferably 160 or more and less than 220.

(5) It is preferable that the coarse grain region 31 constitutes the side-wall outer region 15 and the fine grain region constitutes the side-wall inner region 17 after heat treatment.

(6) It is preferable that the ratio of the coarse grain region 31 is 10% or more and less than 90% after heat treatment.

INDUSTRIAL APPLICABILITY

Although the present invention has been described based on embodiments and examples, the present invention is not limited to the above-described embodiments and examples.

It is to be understood by those skilled in the art that various modifications and improvements are conceivable, and these modifications and improvements are to be included within the scope of the present invention.

For example, in the above embodiments, a molybdenum crucible is given as an example to grow a single crystal sapphire, but it is not limited to the growth of single crystal sapphire.

REFERENCE SIGNS LIST

3: bottom; 11: inner wall; 13: outer wall; 15: side-wall outer region; 17: side-wall inner region; 21: side wall; 23: boundary; 31: coarse grain region; 33: fine grain region; 39: fine grain; 41: crystal grain; 100: molybdenum crucible; 101: untreated crucible; R1: region; R2: region

The invention claimed is:

1. A molybdenum crucible comprising:
   a cylindrical side wall; and
   a bottom provided integrally with one end of the cylindrical side wall,
   the cylindrical side wall including:
   a coarse grain region which is defined as in the following and configured to extend from an outer wall toward an inner wall; and
   a fine grain region which is defined as in the following and configured to extend from the inner wall toward the outer wall so as to be in contact with the coarse grain region,
   a ratio of the coarse grain region in the cylindrical side wall in a thickness direction thereof is 10% or more and less than 90%,
   the coarse grain region being defined as such a region in which crystal grains having a grain size of 1 mm or more determined by an intercept method in a height direction of the crucible occupy 95% or more of an area of a measurement region, and
   the fine grain region being defined as such a region in which crystal grains having a grain size of 10 μm or more and 500 μm or less determined by the intercept method in the height direction of the crucible occupy 95% or more of an area of a measurement region,
   wherein the molybdenum crucible has a purity of 99.9 mass % or more, and consists of only inevitable impurities as a remainder.

2. The molybdenum crucible according to claim 1, wherein
   the ratio of the coarse grain region in the cylindrical side wall in the thickness direction thereof is 40% or more and less than 80%.

3. The molybdenum crucible according to claim 1, wherein
when the cylindrical side wall is equally divided into 8 parts in the thickness direction from the inner wall side toward the outer wall side, a side-wall outer region which is the seventh part when counted from the inner wall side is the coarse grain region, and
when the cylindrical side wall is equally divided into 8 parts in the thickness direction from the inner wall side toward the outer wall side, a side-wall inner region which is the second part when counted from the inner wall side is the fine grain region.

4. The molybdenum crucible according to claim 3, wherein
an aspect ratio of crystal grains in the side-wall inner region is 1.0 or more and 2.0 or less.

5. The molybdenum crucible according to claim 3, wherein
an aspect ratio of crystal grains in the side-wall inner region is 1.0 or more and 1.5 or less.

6. The molybdenum crucible according to claim 1, wherein
the molybdenum crucible has a Vickers hardness Hv of 140 or more and 190 or less.

7. The molybdenum crucible according to claim 1, wherein
the molybdenum crucible has a Vickers hardness Hv of 150 or more and 180 or less.

* * * * *